US006997736B2

(12) United States Patent
Costello et al.

(10) Patent No.: US 6,997,736 B2
(45) Date of Patent: Feb. 14, 2006

(54) GUIDE RECEPTACLE WITH TANDEM MOUNTING FEATURES

(75) Inventors: Brian Patrick Costello, Scotts Valley, CA (US); George Richard Defibaugh, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/810,135

(22) Filed: Mar. 26, 2004

(65) Prior Publication Data

US 2005/0215107 A1 Sep. 29, 2005

(51) Int. Cl.
*H01R 13/64* (2006.01)

(52) U.S. Cl. .......................................... 439/378; 439/59

(58) Field of Classification Search .................. 439/64, 439/59, 378, 374, 540.1; 361/804, 770; 174/386
See application file for complete search history.

(56) References Cited

U.S. PATENT DOCUMENTS 4,444,318 A * 4/1984 Alexander .................. 361/804
4,820,169 A * 4/1989 Weber et al. ................. 439/65
4,855,873 A * 8/1989 Bhargava et al. ........... 361/818
4,875,140 A * 10/1989 Delpech et al. ............. 361/789
5,018,982 A * 5/1991 Speraw et al. ................ 439/74
5,125,849 A * 6/1992 Briggs et al. ............... 439/378
5,754,412 A * 5/1998 Clavin ........................ 361/804
5,825,633 A * 10/1998 Bujalski et al. ............. 361/804
5,963,432 A * 10/1999 Crowley ..................... 361/804
6,205,700 B1 3/2001 Rigby et al. .................. 439/79
6,726,505 B2 * 4/2004 Cermak et al. ............. 439/567
6,739,880 B2 * 5/2004 Toyota ........................ 439/74
6,757,177 B2 6/2004 Harris et al. ................ 361/788

* cited by examiner

*Primary Examiner*—Briggitte R. Hammond

(57) ABSTRACT

A guide module is provided for connecting a primary circuit board and a secondary circuit board to a common backplane circuit board. The module includes a body that has opposed top and bottom surfaces. A locating feature, on one of the body top and bottom surfaces, establishes a stack height for the secondary circuit board with respect to the primary circuit board. The guide module includes a front face defining a plane that is aligned perpendicular to a mating direction of the primary and secondary boards to the backplane board. The locating feature includes a raised fitting that has a centering rib on an outer perimeter thereof. The raised fitting is received in an attachment hole in the secondary circuit board. The locating feature also includes a boss that has an upper surface upon which the secondary circuit board rests when coupled to the primary circuit board. The upper surface of the boss establishes the stack height.

10 Claims, 4 Drawing Sheets

GUIDE RECEPTACLE WITH TANDEM MOUNTING FEATURES

BACKGROUND OF THE INVENTION

The invention relates generally to circuit board interfacing and, more particularly, to interfacing a stacked arrangement of circuit boards to a common backplane.

As more functionality is added to electrical circuits and as electrical components become more miniaturized, the demand for circuit board interfaces with multiple interface connections has increased. Additional challenges are produced by the increasing speeds and density of signals transmitted across circuit board interfaces. It would be desirable to address these issues without adding bulk or complexity to the systems.

One approach to addressing these issues is in the use of stacked or tiered daughter boards that are interfaced with a common backplane or mid plane board. Heretofore, tiered circuit boards were arranged using standoffs to mechanically link the daughter boards together. In some applications, such as with low speed card edge connectors, for example, tolerances are such that standoffs can be used with satisfactory results. While standoffs join the circuit boards together, they are not closely coupled to the interface connectors. In the case of high speed, high density connections, the resulting lack of precision in positioning the circuit boards with standoffs causes problems.

As an alternative to standoffs, high speed, high density interfaces often position all of the interface connectors on one board and use guide pins for aligning the boards being mated. Standoffs may also be used, but only to separate the stacked circuit boards.

With the growing demand for interface connectors on multiple stacked boards that interface to a common backplane, the problems with tolerance and precision still exist.

BRIEF DESCRIPTION OF THE INVENTION

In one embodiment of the invention, a guide module is provided for connecting a primary circuit board and a secondary circuit board to a common backplane circuit board. The primary and secondary boards are in a tiered arrangement with both the primary and secondary circuit boards having interface connections on the backplane circuit board. The module includes a body that has opposed top and bottom surfaces. A locating feature, on one of the body top and bottom surfaces, establishes a stack height for the secondary circuit board with respect to the primary circuit board.

Optionally, the guide module includes a front face defining a plane that is aligned perpendicular to a mating direction of the primary and secondary boards to the backplane board. The locating feature includes a raised fitting that has a centering rib on an outer perimeter thereof. The raised fitting is received in an attachment hole in the secondary circuit board. The locating feature also includes a boss that has an upper surface upon which the secondary circuit board rests when coupled to the primary circuit board. The upper surface of the boss establishes the stack height.

In another embodiment, a guide module is provided for connecting a primary circuit board and a secondary circuit board to a common backplane circuit board. The primary and secondary boards are in a tiered arrangement with both the primary and secondary circuit boards having interface connections on the backplane circuit board. The module includes a body having opposed top and bottom surfaces. A locating feature located on one of the body top and bottom surfaces defines a stacking plane for the secondary circuit board when the secondary circuit board is coupled to the primary circuit board.

In yet another embodiment, a stacked circuit board assembly is provided that includes a primary circuit board that has an interface for electrically connecting the primary circuit board to a primary circuit board interface on a backplane circuit board. A secondary circuit board has an interface for electrically connecting the secondary circuit board to a secondary circuit board interface on the backplane circuit board. A guide module is attached to the primary circuit board for mechanically connecting the primary and secondary circuit boards to one another in a tiered arrangement. The guide module provides a common datum for connecting the primary and secondary circuit boards to the backplane circuit board.

DETAILED DESCRIPTION OF THE INVENTION

Figure 1:
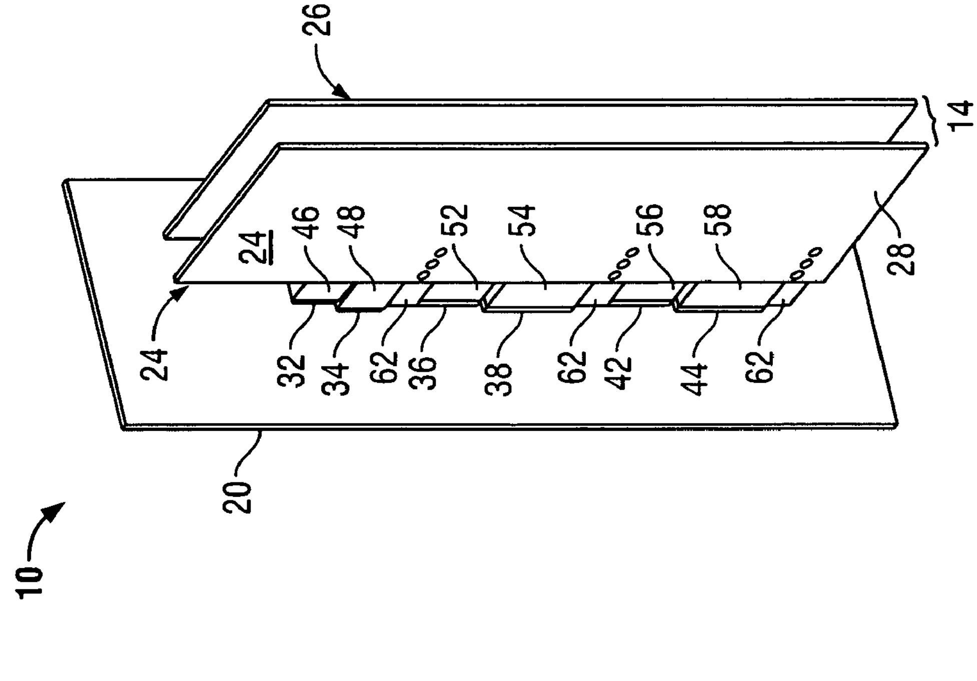
FIG. 1 is a perspective view of a circuit board assembly including a daughter and mezzanine board assembly joined with a backplane board in accordance with an embodiment of the present invention.

FIG. 1 illustrates a circuit board assembly 10 including a tiered circuit board assembly 14 connected to a backplane circuit board 20. The tiered circuit board assembly 14 includes a daughter circuit board 24 and a mezzanine circuit board 26. Hereinafter the term "board" shall be synonymous with the term circuit board. The view in FIG. 1 shows the underside 28 of the daughter board 24.

By way of example only, the backplane 20 includes power connectors 32 and 34 and signal connectors 36, 38, 42 and 44. The power connector 32 is mated with a power connector 46 on the mezzanine board 26. The signal connectors 36 and 42 are mated with signal connectors 52 and 56 respectively on the mezzanine board 26. The power connector 34 is mated with a power connector 48 on the daughter board 24 while signal connectors 38 and 44 are mated with signal connectors 54 and 58 respectively on the daughter board 24. In addition, the daughter board 24 includes guide modules 62 that receive guide pins 66 (shown in FIG. 2) to position and align both the daughter board 24 and the mezzanine board 26 with the backplane board 20. That is, the guide modules 62 facilitate the establishment of perpendicularity between the daughter board and mezzanine board assembly 14 and the backplane board 20 as well as lateral positioning of the interface connections. Thus, in the assembly 14, two sets of interface connectors, 48, 54, and 58 on the daughter board 24, and 46, 52, and 56 on the mezzanine board 26, are sandwiched together simulating a single set of connectors interfaced to the backplane 20.

In high speed, high density electrical circuits, the signal quality degrades if there is too much misalignment in any of the connections from the daughter board 24 or the mezzanine board 26 to the backplane board 20. In the circuit board assembly 14, the guide modules 62 mechanically interconnect the daughter board 24 and the mezzanine board 26 and provide a common datum, as will be described, for all the connections from both the daughter board 24 and the mezzanine board 26 to the backplane board 20. Though shown in FIG. 1 as attached to the daughter board 24, it is to be understood that the guide modules 62 may be attached to the mezzanine board 26. In either case, the board having the guide modules 62 attached is referred to as the primary board while the board coupled to the guide modules 62 is referred to as the secondary board. In the illustrated assembly 14, the daughter board 24 is the primary board while the mezzanine board 26 is the secondary board. Additionally, while three guide modules 62 are shown in the examples herein, it is to be understood that the number of guide modules 62 can be varied to the particular application. However, at least two guide modules 62 are generally recommended to achieve proper spacing and alignment between the primary and the secondary boards, which in this example, are the daughter board 24 and the mezzanine board 26, respectively.

Figure 2:
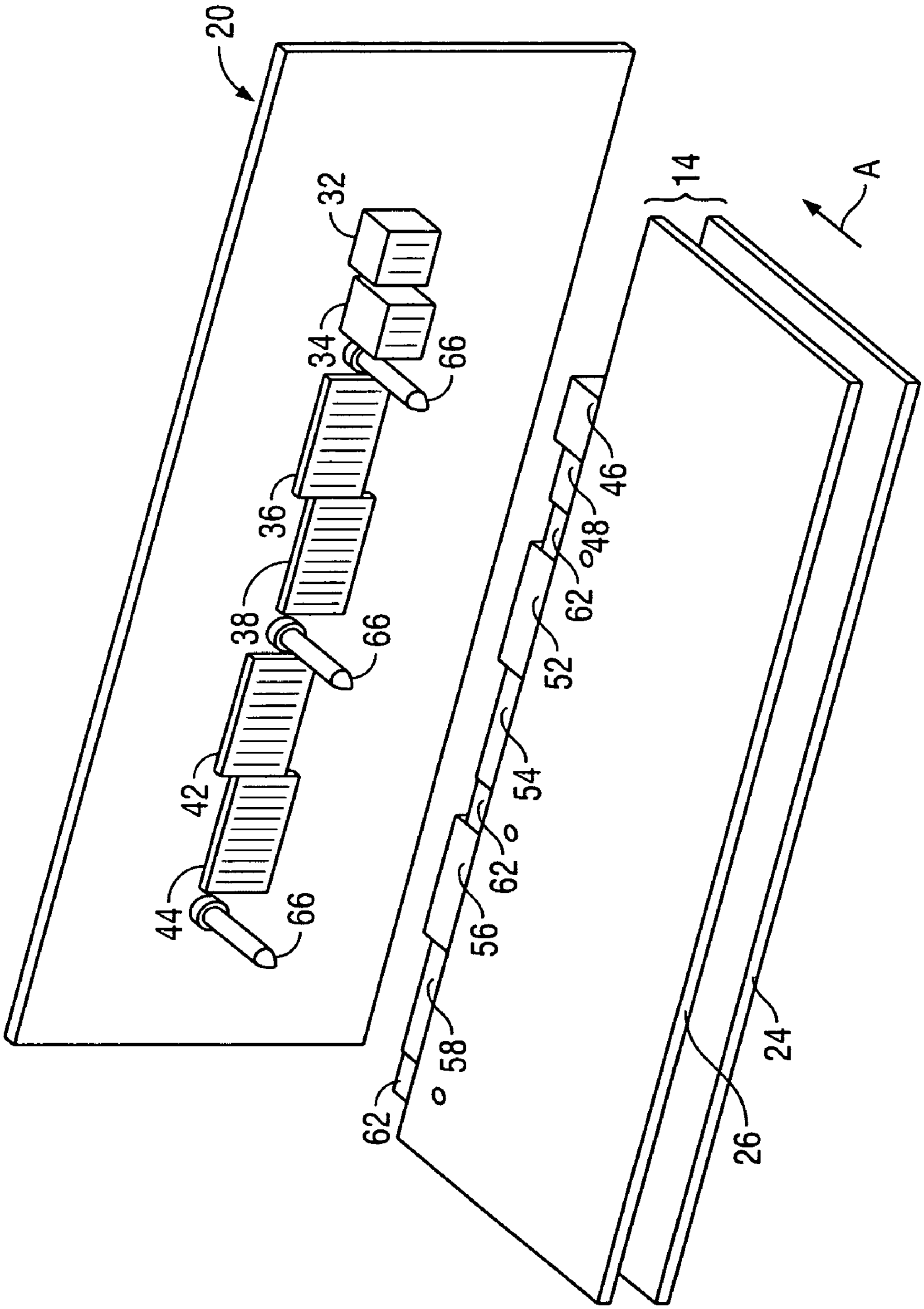
FIG. 2 is a perspective view of the assembly of FIG. 1 with the daughter and mezzanine board assembly separated from the backplane board.

FIG. 2 illustrates the circuit board assembly 14 separated from the backplane board 20. The guide pins 66 are received in the guide modules 62 and the assembly 14 is mated to the backplane board 20 by moving the assembly 14 in the direction of arrow A. The circuit design of the backplane board 20 determines the interface connections 32, 34, 36, 38, 42 and 44 that are present on the backplane board 20 which in term governs the interface connections 46, 48, 52, 54, 56 and 58 on the daughter and mezzanine board assembly 14. When the assembly 14 is mated with the backplane board 20, the interface connections 46, 48, 52, 54, 56 and 58 on both the daughter board 24 and the mezzanine board 26 are simultaneously joined with the corresponding interface connections 32, 34, 36, 38, 42 and 44 on the backplane board 20.

Figure 3:
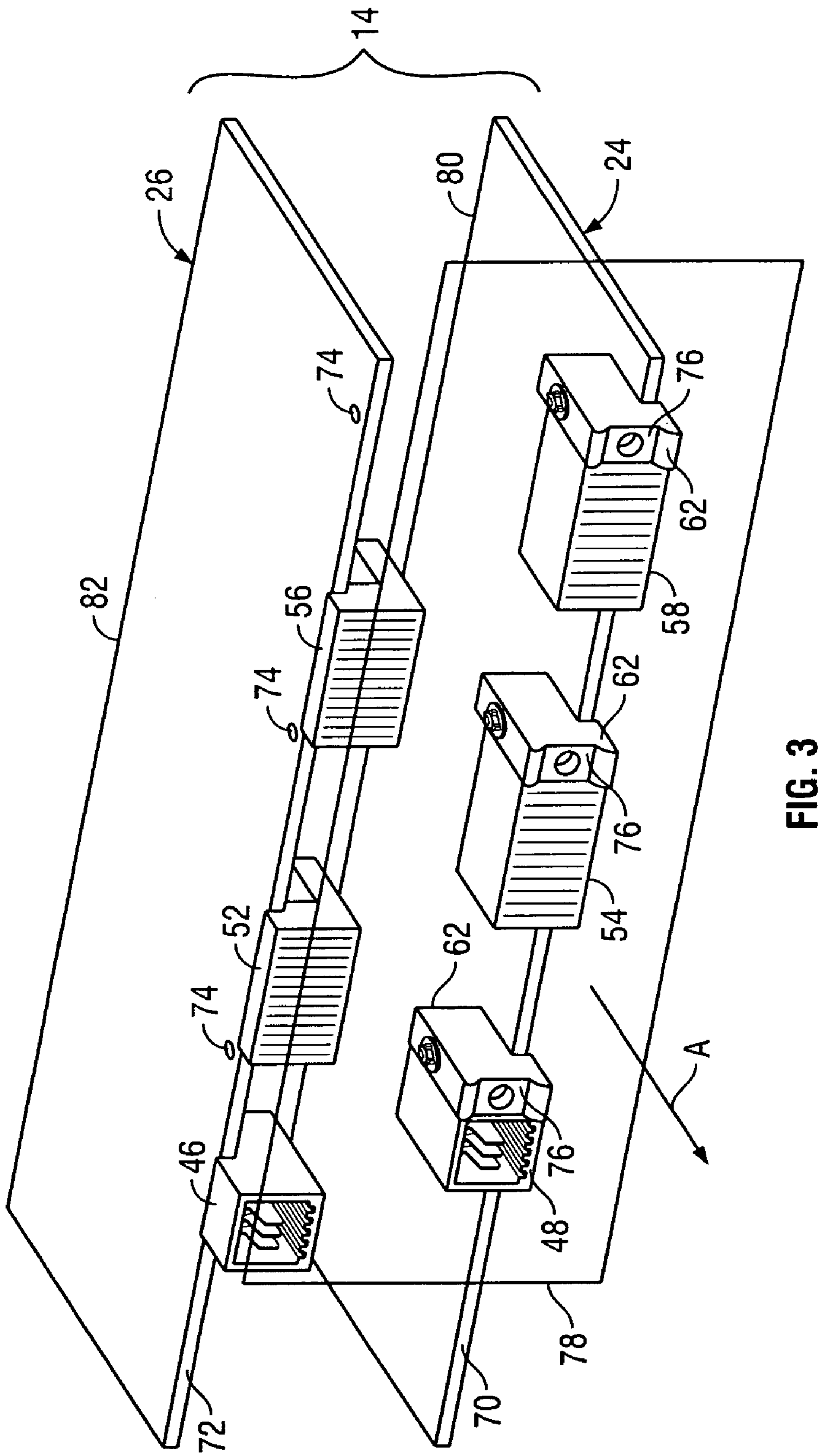
FIG. 3 is a perspective view showing the daughter and mezzanine boards of FIG. 2 separated from one another.

FIG. 3 illustrates the circuit board assembly 14 with the daughter board 24 and the mezzanine board 26 separated from one another and viewed from their forward mating edges 70 and 72 respectively. The guide modules 62 are attached to the daughter board 24. Thus, in the assembly 14, the daughter board 24 is the primary board while the mezzanine board 26 is the secondary board. However, the guide modules could be attached to the mezzanine board 26 which would make the mezzanine board the primary board and the daughter board 24 the secondary board. The mezzanine board 26 includes mounting holes 74 for attachment of the mezzanine board 26 to the guide modules 62. The guide modules 62 provide a datum for connecting both the daughter board 24 and the mezzanine board 26 to the backplane board 20. The mating faces 76 of the guide modules 62 are located in a common plane 78 that is substantially perpendicular to the direction of mating of the assembly 14 with the backplane board 20 which is indicated by the arrow A. Standoffs (not shown) may be used at the rearward edges 80 and 82 of the daughter board 24 and the mezzanine board 26 for support. The standoffs, however, would not be used to control spacing or alignment between the daughter and mezzanine boards 24 and 26 and if used, the standoffs would be dimensioned so that they do not interfere with the spacing established by the guide modules 62.

Figure 4:
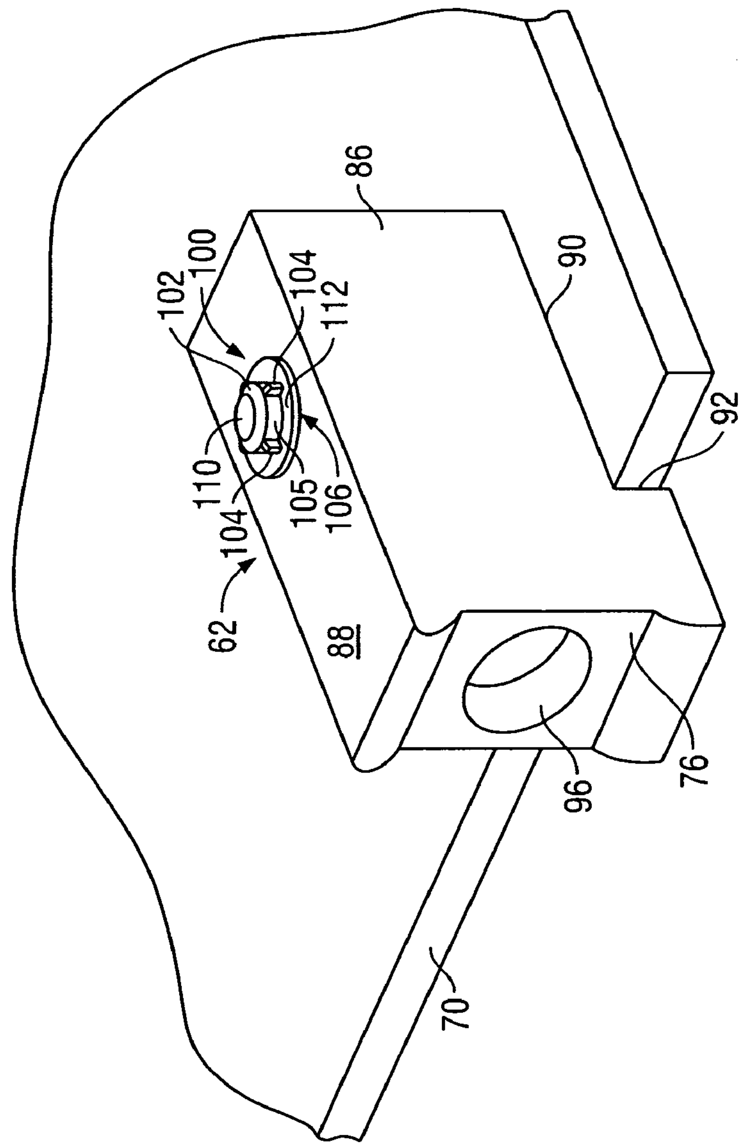
FIG. 4 is a perspective view of a guide module formed in accordance with an embodiment of the present invention.

FIG. 4 illustrates the guide module 62 in detail. The guide module 62 includes a body 86 that has a top surface 88 and an opposed bottom surface 90. In one embodiment, the bottom surface 90 includes a step 92 that overhangs the forward mating edge 70 of the daughter board 24 and may be provided to match an overhang designed on a signal connector (not shown). The top surface 88 and the bottom surface 90 of the guide module 62 are substantially parallel to one another. The front face 76 of the guide module 62 is between the top and bottom surfaces 88 and 90 respectively. The front face 76 includes a pin receptacle 96 that receives a guide pin 66 positioned on the backplane board 20 as shown in FIG. 2. The guide module 62 includes a locating feature 100 located on the top surface 88 of the guide module 62. An identical locating feature is provided on the bottom surface 90 of the guide module 62 which will not be separately described. The locating feature on the bottom surface 90 engages mounting holes (not shown) in the daughter card 24. The locating feature 100 includes a raised fitting 102 that includes a plurality of centering ribs 104 spaced about a perimeter 105 of the raised fitting 102. In an exemplary embodiment, four centering ribs 104 are used that are spaced relatively at 0, 90, 180 and 270 degrees about the perimeter 105 of the raised fitting 102. In alternate embodiments, a fewer or greater number of centering ribs 104 may be used. Additionally, no centering ribs 104 could be used where the raised fitting 102 is designed for a close fit or interference fit with the mounting holes 74 (see FIG. 3).

The locating feature also includes a boss 106 positioned at the base of the raised fitting 102. As shown in FIG. 4, the raised fitting 102 is generally cylindrical in shape and the boss 106 is concentric with the raised fitting 102. Though shown as cylindrical in shape, it is to be understood that the raised fitting 102 may take other shapes that may be square, rectangular, elliptical, etc. in cross section. It is also to be understood, that the mounting holes 74 (see FIG. 3) in the mezzanine board 26 would be complimentary in shape to that of the raised fitting 102. The boss 106 can be fabricated in varying thickness to facilitate adjusting the stack height or spacing between the daughter board 24 and the mezzanine board 26 to suit a particular application. In alternative embodiments, the boss 106 may not be present. Spacing can be varied to provide clearance for components positioned between the daughter board 24 and the mezzanine board 26. The raised fitting 102 also includes a hole 110 that is used for securing the mezzanine board 26 to the guide module 62. In one embodiment, the locating feature 100 is molded with the guide module 62. When the locating feature 100 is molded with the guide module 62, one aspect of the tolerance stack in the components is eliminated. This reduces the potential for misalignment of the assembly 14 with the backplane board 20.

Figure 5:
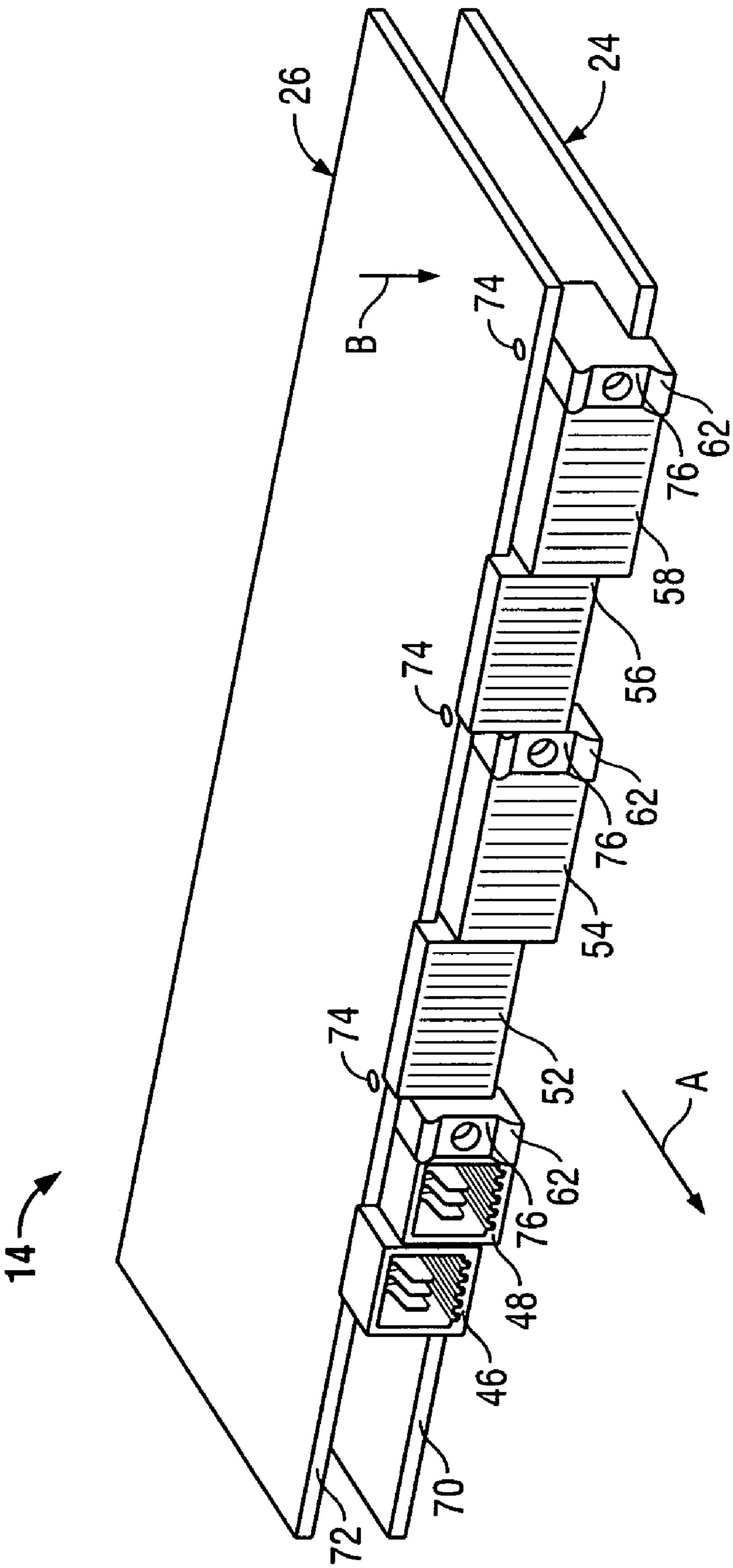
FIG. 5 is a perspective view of the daughter and mezzanine board assembly of FIG. 2 taken from the connector edge.

FIG. 5 illustrates a completed assembly 14 viewed from the mating edges 70 and 72 of the daughter board 24 and the mezzanine board 26 respectively. The assembly 14 is formed by mechanically joining the daughter board 24 and the mezzanine board 26 such that they are aligned by the guide modules 62. The locating feature 100 is molded with the guide module 62 to provide a predetermined spacing between the daughter board 24 and the mezzanine board 26. The locating feature 100 is fabricated with a boss 106 of a predetermined thickness so that a desired overall spacing can be achieved when the locating feature 100 is molded with the guide module 62.

When the daughter board 24 and the mezzanine board 26 are coupled together, the mezzanine board 26 rests on the top surface 112 (shown in FIG. 4) of the boss 106. When positioning the mezzanine board 26 onto the guide module

62, the mounting holes 74 of the mezzanine board 26 are positioned over the raised fitting 102 of the locating feature. The centering ribs 104 on the raised fitting 102 (See FIG. 4) center the raised fittings 102 in the mounting holes 74 of the mezzanine board 26. Downward pressure in the direction of arrow B, causes the center ribs 104 to bite into the board material of the mezzanine board 26 to inhibit movement of the mezzanine board 26 which would otherwise produce misalignment in the assembly 14. An appropriate fastener (not shown) is inserted through the mezzanine board mounting hole 74 and into the mounting hole 110 and the guide module to secure the mezzanine board 26 to the guide modules 62. The mezzanine board 26 is now referenced to the guide modules 62 such that the guide modules 62 become a common datum for both the daughter board 24 and the mezzanine board 26.

The guide modules 62 are first attached to the daughter board 24. During attachment to the daughter board 24, the guide modules 62 are located such that the mating faces 76 are in a common plane 78 (shown in FIG. 3) that is perpendicular to the direction of mating of the assembly 14 to the backplane board 20 as indicated by the arrow A. During the molding process, the locating feature 100 (shown in FIG. 4) is positioned relative to the guide module 62 to assure that the boss top surface 112 (shown in FIG. 4) is substantially parallel to the guide module bottom surface 90 (shown in FIG. 4). This relationship, along with a uniform stacking height, provides a common stacking plane for the mezzanine board 26 across the guide module 62 of the assembly 14. The connectors 46, 48, 52, 54, 56 and 58 are attached to their respective daughter board 24 or mezzanine board 26 relative to the guide module 62 according to the interface connector arrangement used on the backplane board 20 for which the assembly 14 is designed.

The embodiments thus described provide a guide module that is suitable for connecting tiered circuit board assemblies to a common backplane in high speed, high density circuits. The guide modules establish the spacing and orientation of the tiered circuit board assembly thereby providing the precision required to maintain signal quality in high speed, high density circuit board assembly-to-backplane interface connections. Spacing can also be varied to allow for varying component heights between the primary and secondary boards.

While the invention has been described in terms of various specific embodiments, those skilled in the art will recognize that the invention can be practiced with modification within the spirit and scope of the claims.

What is claimed is:

1. A guide module for connecting a primary circuit board and a secondary circuit board to a common backplane circuit board, the primary and secondary boards being in a tiered arrangement with both the primary and secondary circuit boards having interface connections on the backplane circuit board, said module comprising:

a body having opposed top and bottom surfaces, said bottom surface including a step configured to engage an edge of the primary circuit board, and wherein said body includes a front face between said top and bottom surfaces, said front face defining a receptacle for a guide pin on the backplane circuit board; and a locating feature located on one of said body top and bottom surfaces, said locating feature comprising a raised fitting having a base and a boss positioned at said base, said locating feature establishing a stack height for the secondary circuit board with respect to the primary circuit board.

2. The guide module of claim 1, wherein said front face defines a plane that is aligned perpendicular to a mating direction of the primary and secondary boards to the backplane board.

3. The guide module of claim 1, wherein said raised fitting includes a centering rib on an outer perimeter thereof, said raised fitting being received in an attachment hole in the secondary circuit board, and wherein said centering rib is configured to penetrate the secondary circuit board to prevent relative movement between said raised fitting and the secondary circuit board.

4. The guide module of claim 1, wherein said raised fitting includes a top surface defining a hole configured to receive a fastener to secure the secondary circuit board to said guide module.

5. The guide module of claim 1, wherein said boss has an upper surface, the secondary circuit board resting on said upper surface of said boss when coupled to the primary circuit board, said upper surface of said boss establishing said stack height.

6. A guide module for connecting a primary circuit board and a secondary circuit board to a common backplane circuit board, the primary and secondary boards being in a tiered arrangement with both said primary and secondary circuit boards having interface connections on the backplane circuit board, said module comprising:

a body including opposed top and bottom surfaces, said bottom surface including a step configured to engage an edge of the primary circuit board, and wherein said body includes a front face between said top and bottom surfaces, said front face defining a receptacle for a guide pin on the backplane circuit board; and a locating feature located on one of said body top and bottom surfaces, said locating feature comprising a raised fitting having a base and a boss positioned at said base, said locating feature defining a stacking plane for the secondary circuit board when the secondary circuit board is coupled to the primary circuit board.

7. The guide module of claim 6, wherein said front face defines a plane that is aligned perpendicular to a mating direction of the primary and secondary boards to the backplane board.

8. The guide module of claim 6, wherein said raised fitting includes a centering rib on an outer perimeter thereof, said raised fitting being received in an attachment hole in the secondary circuit board, and wherein said centering rib is configured to penetrate the secondary circuit board to prevent relative movement between said raised fitting and the secondary circuit board.

9. The guide module of claim 6, wherein said raised fitting includes a top surface defining a hole configured to receive a fastener to secure the secondary circuit board to said guide module.

10. The guide module of claim 6, wherein said boss has an upper surface, the secondary circuit board resting on said upper surface of said boss when coupled to the primary circuit board, said upper surface of said boss defining said stacking plane.

* * * * *